(12) United States Patent
Reeder

(10) Patent No.: US 7,767,557 B2
(45) Date of Patent: Aug. 3, 2010

(54) CHILLED WAFER DICING

(75) Inventor: William Jeffery Reeder, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/747,310

(22) Filed: May 11, 2007

(65) Prior Publication Data

US 2008/0280423 A1    Nov. 13, 2008

(51) Int. Cl.
H01L 21/00    (2006.01)
(52) U.S. Cl. .................. 438/465; 134/902; 438/460; 438/464
(58) Field of Classification Search .......... 438/460, 438/465, 462, 464; 83/15, 22, 24; 427/374.2; 134/1.3, 34, 22.18, 902
See application file for complete search history.

(56) References Cited

U.S. PATENT DOCUMENTS 4,519,846 A * 5/1985 Aigo ........................ 134/15
5,543,365 A * 8/1996 Wills et al. .................. 438/462
5,934,973 A * 8/1999 Boucher et al. ............... 451/5
6,589,855 B2 * 7/2003 Miyamoto et al. .......... 438/464

FOREIGN PATENT DOCUMENTS

JP    09106967 A  *  4/1997
JP    2006041399 A  *  2/2006

OTHER PUBLICATIONS

Machine Translation of JP-09106967A.*
Machine Translation of JP-2006041399A.*
Human Translation of Sakamto, JP 200641399.*
Human Translation of Inaba, JP 09106967.*

* cited by examiner

Primary Examiner—David Vu
Assistant Examiner—Suberr Chi
(74) Attorney, Agent, or Firm—Wells St. John P.S.

(57) ABSTRACT

A method for dicing a wafer is disclosed. One illustrative method includes forming a layer of frozen material above a plurality of integrated circuit dies on a substrate and performing a cutting process to cut through the layer of frozen material and the substrate to singulate the plurality of dies. Another method includes performing a cutting process to singulate a plurality of integrated circuit dies having a layer of frozen material formed above the plurality of dies.

5 Claims, 4 Drawing Sheets

CHILLED WAFER DICING

BACKGROUND OF THE INVENTION

1. Field of the Invention

The present invention is generally directed to the field of manufacturing integrated circuit devices, and, more particularly, to systems and methods for dicing a wafer.

2. Description of the Related Art

The manufacturing of semiconductor devices may involve many process steps. For example, semiconductor fabrication typically involves processes such as deposition processes, etching processes, thermal growth processes, various heat treatment processes, ion implantation, photolithography, etc. Such processes may be performed in any of a variety of different combinations to produce semiconductor devices that are useful in a wide variety of applications.

Integrated circuit devices are formed in regions of a semiconducting substrate known as die. The number of die on a particular substrate depends upon the particular type of integrated circuit device and the size of the substrate. Typically, a substrate may have hundreds of die formed thereon.

After the integrated circuit devices are manufactured and tested, they must be packaged for sale. This packaging process typically involves coupling the die to another structure, such as a leadframe, so that electrical connections can be made between the die and other electrical components or devices, e.g., a printed circuit board. Packaging also typically involves encapsulating all or a portion of the die within an encapsulant material, e.g., mold compound. A vast number of techniques and structure have been and continue to be employed in packaging the vast number of integrated circuit devices on the market.

Typically, each of the individual die on a substrate are separated or singulated by cutting the substrate with a dicing saw. The saw blades used during the wafer dicing operation are typically made of diamond particles that are embedded or bonded in a metal matrix. Such saw blades are well-suited for cutting relatively hard, brittle materials, such as silicon. During dicing operations, the saw blade is rotated at a very high rate of speed, and the diamonds make small chips in the silicon substrate.

In some cases, various relatively soft materials are applied to the substrate, e.g., die attach tape attached to the backside of the substrate, protective polymeric films or layers on the active side (front side) of the substrate, etc. Typically, these layers are applied to the substrate prior to performing the saw-cutting or dicing process. In some cases, these layers of material are intended to remain in place as part of the finished product. For example, laminated layers of material may be applied to the backside of the substrate to protect the die in direct flip chip packaging applications, adhesive films may be attached for use as die attach materials, particularly in die stacking applications, and optical films may be applied to control or manage light penetration and/or reflection in optical devices, e.g., CMOS imager devices.

The chips generated during the dicing process may cause several problems. For example, the functional circuitry and structures on the die may be damaged by impact impingement with the chips or particles created during dicing operations. In later process operations, such particles or chips may be inadvertently pressed into the functional circuitry on the die. For example, this may occur in subsequent processes such as die picking, die stacking and/or encapsulation. Particles that adhere to the surface of the die may also cause the integrated circuit device to fail or underperform during later operations. For example, the particles that adhere to the surface of the die can create a stress point on the die without causing a detectable failure when the device is first made. However, over time, such a stress point may lead to fatigue failure during the operational life of the integrated circuit device. For optical devices, the presence of such particles can interfere with or prevent the transmission of light for emitting devices or they can prevent or limit the collection of light for sensing devices.

The attachment of various relatively soft films or layers to the substrate, which are subsequently cut during dicing operations, may also cause several problems. One such problem is that the saw blade may become "loaded" with such materials. Blade loading occurs when resin builds up on the surface of the blade or flows into the pores of the blade matrix. Blade loading may decrease cutting efficiency, increase blade heating, decrease blade life, increase blade breakage and/or cause an increase in chipping of the substrate. Additionally, as the blade cuts through soft polymeric material, it tends to melt that material. As the blade spins, this material may be cast off and may be deposited on the surface of the dies. Such particles may lead to functional failure or yield loss of the integrated circuit devices. For example, polymeric particulars that are deposited on wire bond pads are known to cause so-called wire bond "no sticks," which may result in significant yield loss in semiconductor assembly operations.

BRIEF DESCRIPTION OF THE DRAWINGS

The present subject matter may be understood by reference to the following description taken in conjunction with the accompanying drawings, in which like reference numerals identify like elements, and in which.

Figure 1:
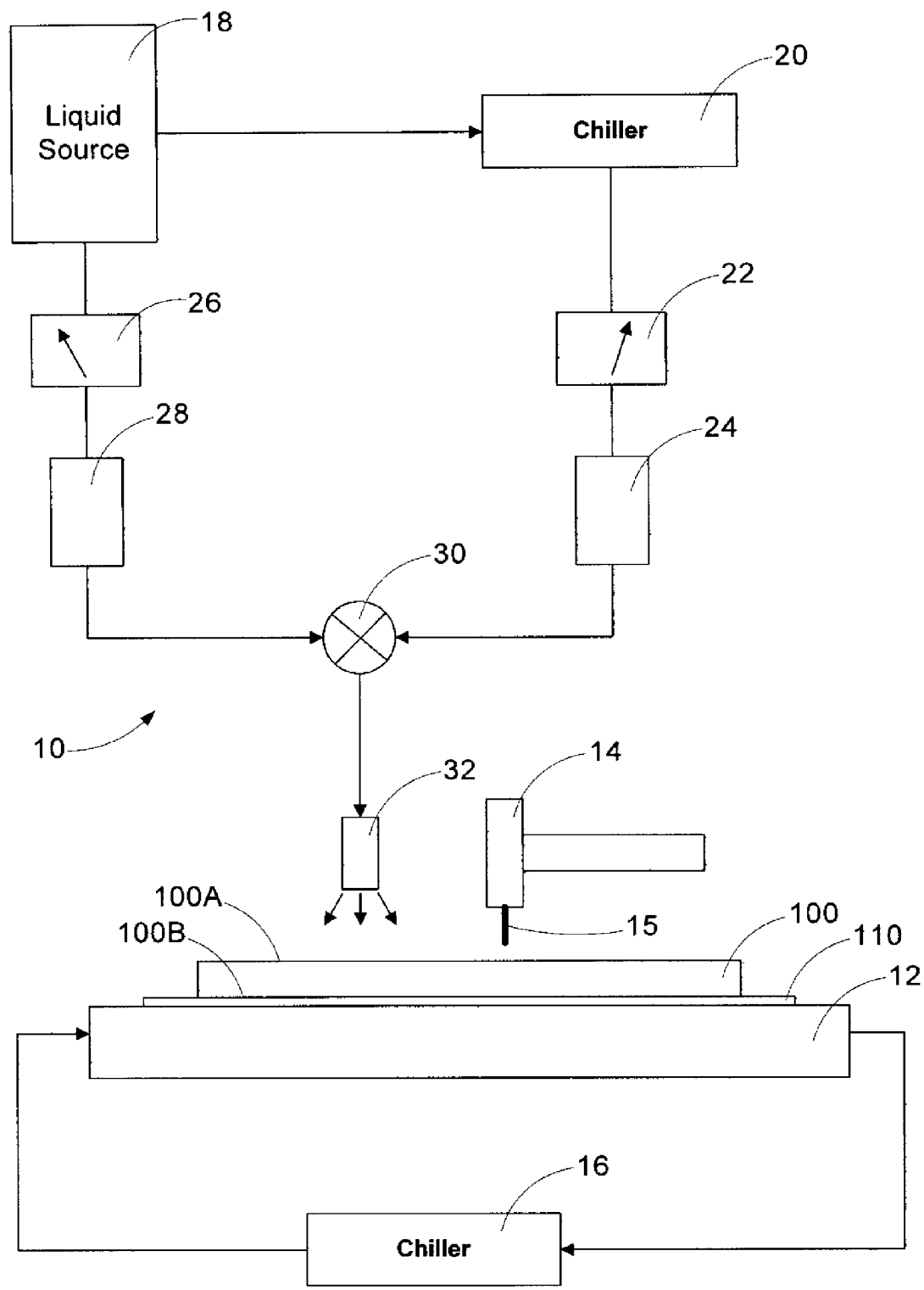
FIG. 1 depicts one illustrative embodiment of a system described herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures and systems for performing during operations are schematically depicted in the drawings. For purposes of clarity and explanation, the relative sizes of the various features depicted in the drawings may be exaggerated or reduced as compared to the size of those features or structures on real-world devices and systems. Nevertheless, the attached drawings are included to describe and explain illustrative examples of the present subject matter.

FIG. 1 depicts one illustrative embodiment of a system 10 as described herein. The system 10 generally comprises a substrate chuck 12, a dicing saw 14, a saw blade 15, a chiller 16, a source or reservoir 18 of process fluid, e.g., water, a chiller 20, a temperature meter 22, a flow meter 24, a temperature meter 26, a flow meter 28, a mixing valve 30 and a nozzle 32. As depicted in FIG. 1, a substrate 100 is positioned on the chuck 12. The chiller 16 is adapted to supply a cooling fluid (liquid or gas), e.g., water or some other medium, to the chuck 12.

It should be noted that the system 10 depicted in FIG. 1 is schematic in nature. That is, various components that might be present in an actual operational system, e.g., circulating pumps, valves, etc., are not depicted so as not to obscure the present disclosure with details that will be readily apparent to those skilled in the art after a complete reading of the present application. Additionally, in many applications, a wafer dicing tape 110 is applied to the backside 100B of the substrate 100 prior to beginning dicing operations.

Figure 2:
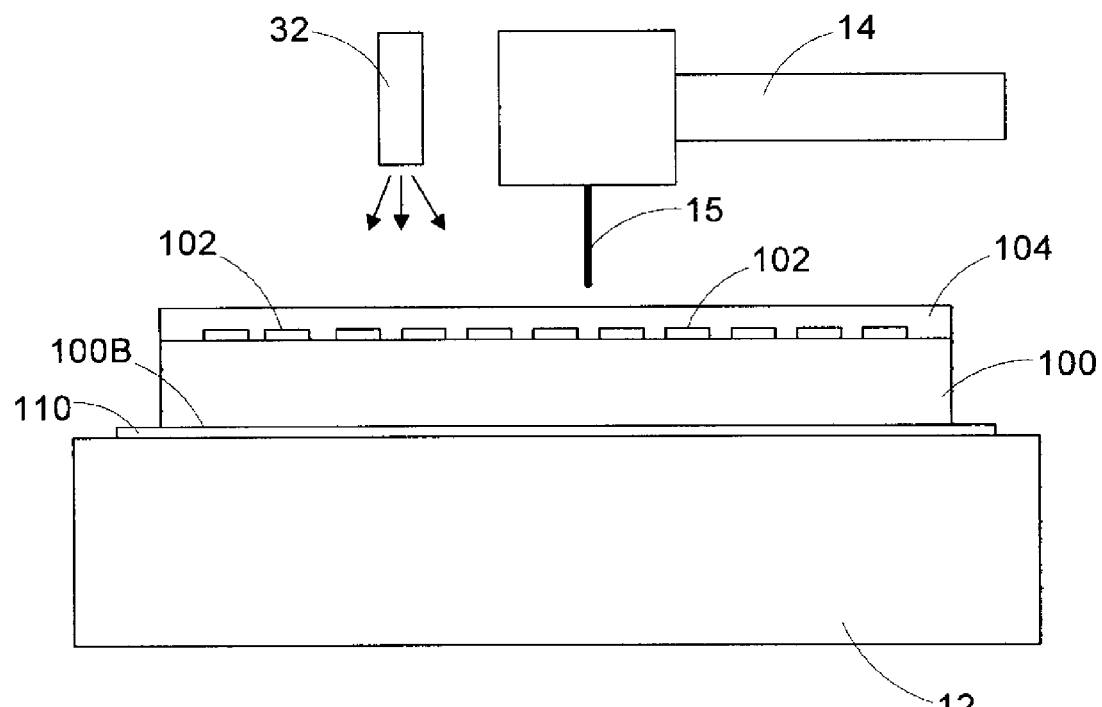
FIGS. 2-4 depict an illustrative technique of dicing a substrate as described herein.

In one particular example, the chiller 16 supplies sufficient cooling fluid to the chuck 12 such that the substrate 100 is cooled to at least the approximate freezing temperature of a fluid to be directed to the top surface 100A of the substrate 100. In the illustrative case where the fluid to be applied to the substrate 100 is water, the chuck 12 may be cooled to a temperature of at least about 0° C. Thereafter, a fluid, e.g., water, is directed toward the surface 100A of the substrate 100, via nozzle 32, such that a frozen layer of material 104 is formed above the substrate 100. FIG. 2 is an enlarged view of the substrate 100 comprised of a plurality of schematically depicted die 102 having the frozen layer of material 104 formed thereabove. The fluid supplied via the nozzle 32 may be chilled by the chiller 20 to any desired temperature. The layer of frozen material 104 may be formed to any desired thickness. For example, the layer of frozen material 104 may have a thickness ranging from approximately 100-500 micron. In one particularly illustrative embodiment, the fluid supplied via the nozzle 32 is water that, when frozen, results in a layer of ice 104.

Figure 3:
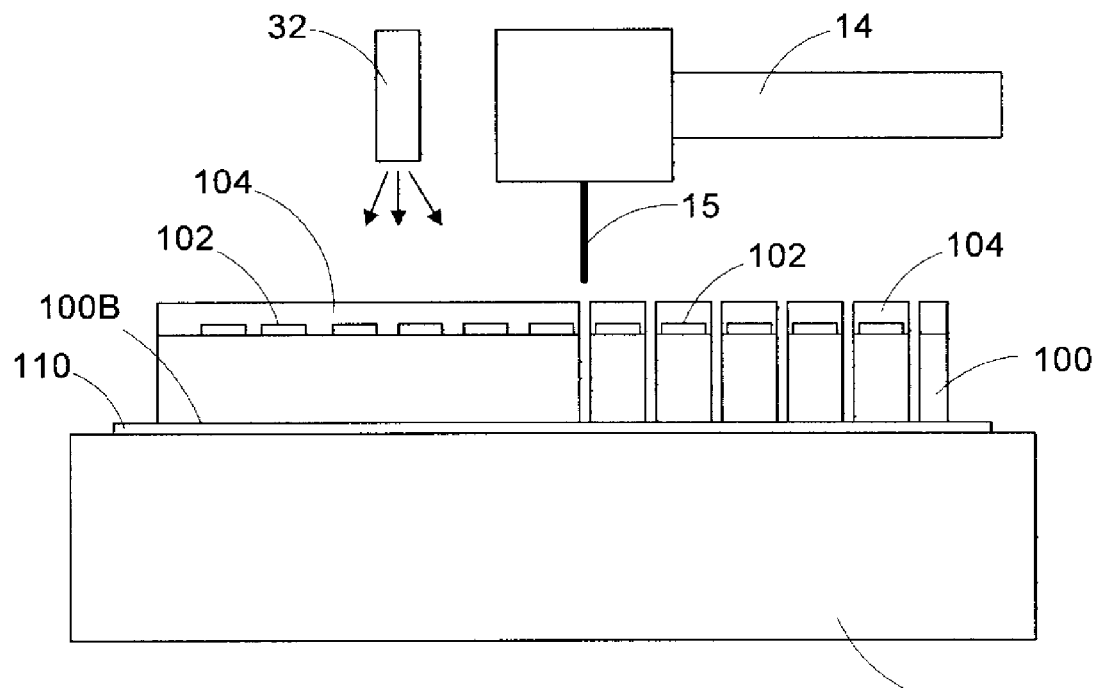

Thereafter, as shown in FIG. 3, dicing operations are performed using the dicing saw 14 to dice the substrate 100 as is commonly done in typical semiconductor dicing operations. During the actual cutting process, additional fluid may be continuously or intermittently supplied to the surface 100A of the substrate 100 via the nozzle 32 or by some other means. Using the methods described herein, particles resulting from the cutting operation may be either trapped in the layer of frozen material 104 or flow away with the fluid that is directed toward the surface of the substrate 100 during the cutting process.

Figure 4:
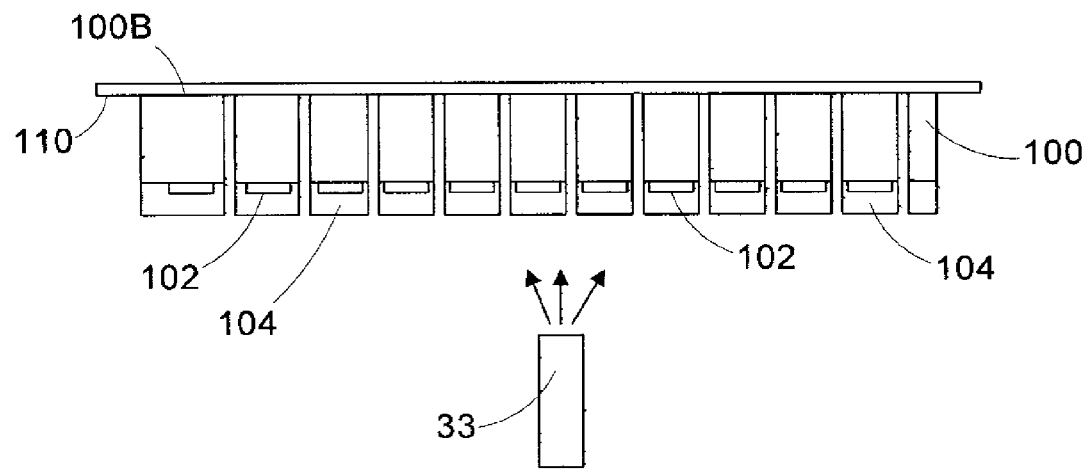

After the substrate 100 is completely diced, the chuck 12 may be warmed by stopping the flow of chilled fluid from the chiller 16 and/or supplying a warm fluid, e.g., warm water, to the chuck 12. The warming of the chuck 12 should tend to cause the layer of frozen material 104 to thaw. During this process, if desired, relatively warm fluid may also be supplied from the reservoir 18 or another source to the substrate 100 via the nozzle 32 or by some other means. This relatively warm fluid may be flowed over the substrate 100 to remove the layer of frozen material 104 and any captured or loose particles resulting from the dicing process. Alternatively, the diced substrate 100 with the layer of frozen material 104 intact may be transferred to a separate station for thawing the layer of frozen material 104 and removing the particles. In another illustrative example, as shown in FIG. 4, the substrate 100 may be flipped upside down and sprayed with a relatively warm fluid, e.g., water, via nozzle 33. In that orientation, the particles would naturally fall away from the diced substrate 100.

In yet another illustrative variation of this process, after the layer of frozen material 104 is fully formed, the substrate 100 may be diced without applying any additional fluid, e.g., water, to the surface of the substrate 100. The layer of frozen material 104 and the chilled chuck 12 would then absorb the heat generated during the dicing process. As the layer of frozen material 104 melts, it would act as a lubricant for the cutting surface of the saw blade 15. As with the other variations, the layer of frozen material 104 would provide protection for the surface 100A of the substrate 100 during the dicing operation.

It should be understood that the various components depicted in FIG. 1 are illustrative and intended to be schematic in nature. For example, the dicing saw 14 may be any type of dicing saw commonly employed in semiconductor manufacturing operations to dice semiconducting substrates. Similarly, the particular configuration of the illustrative system components, e.g., chillers 16, 20, temperature meters 22, 26, flow meters 24, 28, the mixing valve 30 and the nozzle 32, is provided by way of example only. After a complete reading of the present application, those skilled in the art will readily understand that a variety of arrangements may be employed to supply chilled water and/or warm water to the surface of the substrate. Similarly, the chuck 12 may be of traditional configuration. Thus, the particular illustrative arrangement depicted in FIG. 1 should not be considered a limitation of the present invention. Although not depicted in FIGS. 2-4, the substrate 100 may have a film or layer attached to the backside 100B of the substrate 100, e.g., a die attach film. However, such an additional film may or may not be present depending upon the particular application.

As indicated in the background section of the application, one problem encountered in dicing operations is that the blade 15 of the saw 14 may engage relatively soft layers of material attached to the front side 100A or backside 100B of the substrate 100. For example, die attach tape is commonly attached to the backside 100B of a substrate 100 prior to beginning dicing operations. The die attach tape is cut during dicing operations along with the substrates and the tape is used to attach the individual die to a package.

Figure 5:
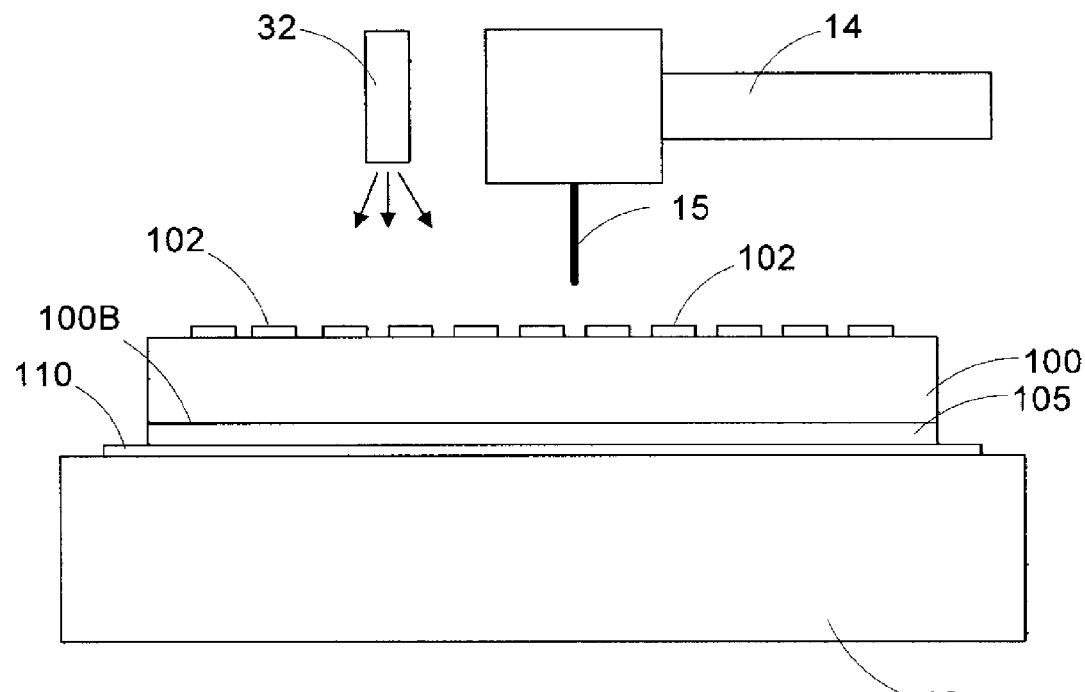
Figure 6:
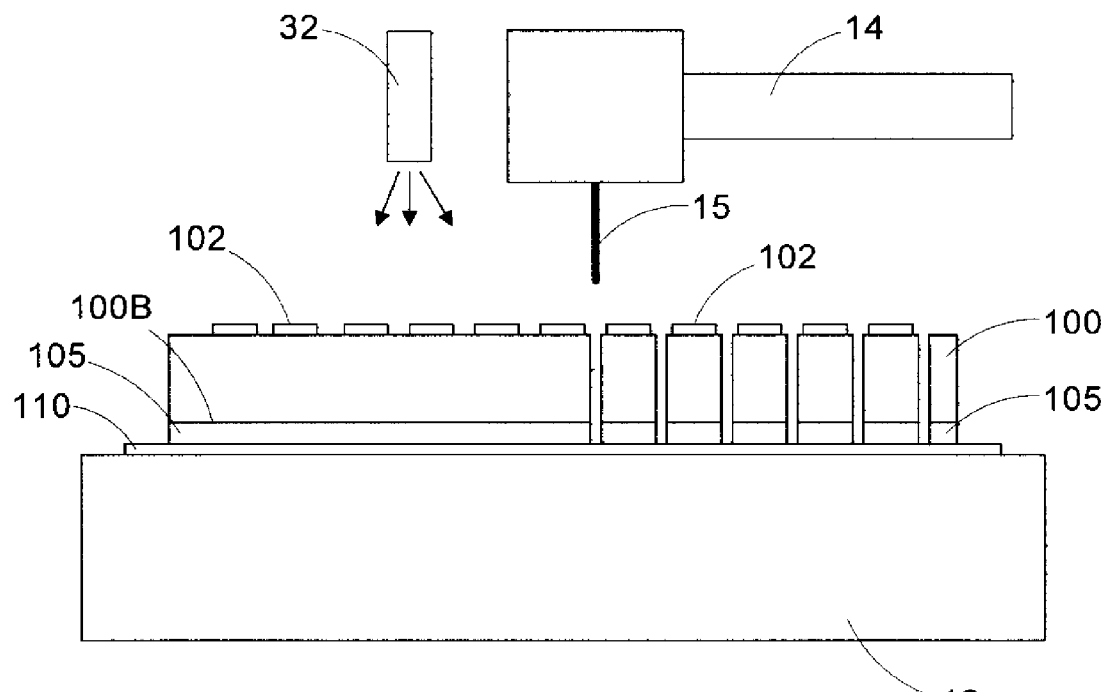

FIG. 5 depicts such an illustrative layer 105 attached to the backside 100B of the substrate 100. In accordance with one aspect of the present disclosure, any such layer(s) 105 attached to the front side 100A or the backside 100B of the substrate 100 may be cooled to facilitate cutting the cooled layer of material. In stating that the layer 105 is attached to the substrate 100, it should be understood that the layer(s) 105 may be directly attached to the backside 100B of the substrate 100 or the front side 100A, or there may be an intermediate layer of material between the layer 105 and the actual front side 100A or backside 100B of the substrate 100. Nevertheless, by stating that the layer(s) 105 are attached to the substrate 100 is intended to cover all such variations.

In general, the layer 105 may be cooled to a temperature that is less than the ambient temperature of the environment where dicing operations will be performed. The exact cooled temperature of the layer 105 may vary depending upon the particular application. Many materials that comprise the layers 105, e.g., polymeric materials, generally become harder and more brittle as their temperature is decreased. For example, Ablestik ATB 240, a common die attach film, has a dynamic tensile modulus of 4 MPa at 150° C., 630 MPa at 25° C. and 3130 MPa at −65° C. Thus, cooling such a layer 105 and making it harder would make it easier to cut using the saw blade 15.

Various techniques may be employed to cool the layer(s) 105. For example, as indicated in FIG. 5, the substrate 100 has a polymeric film or layer 105 laminated to the backside 100B. In this embodiment, a chilling fluid (liquid or gas) is circulated through the cooling chuck 12 to cool the layer 105 to a desired temperature, e.g., below 10° C., below 0° C., etc., to thereby make the layer 105 harder and easier to cut. In this illustrative example, the primary objective is to improve the dicing characteristics of the layer 105. Thus, it is not essential to form a layer of frozen material 104 on the top surface 100A of the substrate 100 as previously described. However, such a layer of frozen material 104 may be formed if desired.

Figure 7:
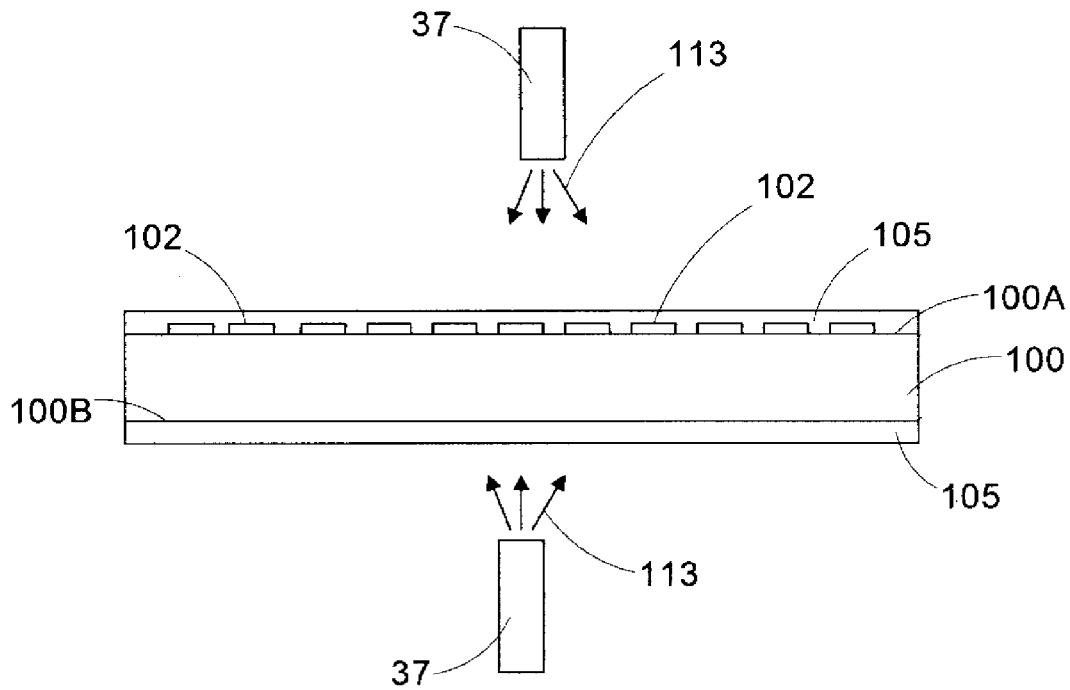
FIGS. 5-7 depict another illustrative technique of dicing a substrate as described herein.

Another technique for cooling the layer 105 would be to direct or spray a cooled fluid 113 (liquid or gas) onto the layers 105 shown in FIG. 7. In this particular example, the substrate 100 has layers 105 attached to both the front side 100A and backside 100B of the substrate 100. The cooled fluid 113 may be applied to the layers 105 via illustrative nozzles 37. The cooled fluid 113 may be any type of fluid that may be used to reduce the temperature of the layers 105, e.g., liquid nitrogen, a refrigerant, a chilled liquid, etc.

Additionally, the layer(s) 105 may be cooled by placing the substrate 100 in a refrigerated environment, e.g., a freezer, for a sufficient period such that the layer(s) 105 reach the desired temperature. Such a refrigerated environment may be a standalone freezer or it may be a portion of a dicing system.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a layer of frozen material above a plurality of integrated circuit dies on a substrate on a cooled chuck;
   performing a cutting process with the substrate on the cooled chuck, without applying any additional fluid, to cut through the layer of frozen material and the substrate to singulate the plurality of dies;
   using only the cutting process, melting some of the frozen material to lubricate a cutting surface of a blade and producing particles from cutting the substrate, sufficient frozen material remaining to protect the substrate from the particles; and
   after the plurality of dies are singulated, applying a liquid to the singulated dies to melt residual frozen material, the substrate being oriented such that the frozen material is facing downward and the liquid is directed upward and the particles from the cutting process falling away from the singulated dies while applying the liquid.

2. The method of claim 1, wherein forming a layer of frozen material on the plurality of integrated circuit dies comprises:
   cooling the substrate to at least a freezing temperature of the frozen material; and
   applying a liquid on the substrate.

3. The method of claim 1, further comprising transferring the singulated dies with the residual frozen material from the cooled chuck to a separate station for applying the liquid.

4. The method of claim 2, wherein cooling the substrate comprises circulating a cooling fluid through a chuck on which the substrate is positioned.

5. The method of claim 1, wherein the frozen material comprises water ice.

\* \* \* \* \*